(12) United States Patent
Peyer et al.

(10) Patent No.: US 10,664,642 B1
(45) Date of Patent: May 26, 2020

(54) CONSTRUCTING VIA MESHES FOR HIGH PERFORMANCE ROUTING ON SILICON CHIPS

(71) Applicant: International Business Machines Corporation, Armonk, NY (US)

(72) Inventors: Sven Peyer, Tuebingen (DE); Christian Schulte, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/205,697

(22) Filed: Nov. 30, 2018

(51) Int. Cl.
*G06F 17/50* (2006.01)
*G06F 30/394* (2020.01)
*H01L 23/528* (2006.01)
*H01L 23/522* (2006.01)

(52) U.S. Cl.
CPC .......... *G06F 30/394* (2020.01); *H01L 23/528* (2013.01); *H01L 23/5226* (2013.01)

(58) Field of Classification Search
CPC ............ G06F 17/5077; G06F 17/5072; G06F 17/5081; G06F 30/394; G06F 30/3947; G06F 30/3953; G06F 30/392; G06F 30/398
USPC ............................. 716/130, 127, 133; 703/15
See application file for complete search history.

(56) References Cited

U.S. PATENT DOCUMENTS

| | | | |
|---|---|---|---|
| 6,424,022 B1 * | 7/2002 | Wu ....................... | H01L 23/552 257/547 |
| 6,829,754 B1 * | 12/2004 | Yu ....................... | G06F 17/5081 707/999.102 |
| 8,645,892 B1 | 2/2014 | Gupta et al. | |
| 9,871,027 B2 | 1/2018 | Kondo | |
| 10,149,958 B1 * | 12/2018 | Tran .................... | G06K 9/00604 |
| 2006/0282814 A1 * | 12/2006 | Percin ..................... | G03F 7/705 382/144 |
| 2007/0006116 A1 * | 1/2007 | Percin ..................... | G03F 1/36 716/53 |
| 2010/0119961 A1 * | 5/2010 | Ye .......................... | G03F 1/144 430/30 |
| 2011/0185331 A1 * | 7/2011 | Baviskar ............. | G06F 17/5068 716/133 |
| 2015/0003281 A1 | 1/2015 | Hasenplaugh et al. | |

(Continued)

OTHER PUBLICATIONS

Cho, K. et al., "Clock Mesh Network Design with Through-Silicon Vias in 3D Integrated Circuits," ETRI Journal, vol. 36, No. 6, Dec. 2014.

*Primary Examiner* — Phallaka Kik
(74) *Attorney, Agent, or Firm* — Scully, Scott, Murphy & Presser, P.C.

(57) ABSTRACT

System and method for configuring via meshes for a semiconductor circuit having at least a bottom layer and a top layer each having a plurality of parallel conductive straps, and vias to interconnect straps in the bottom layer to the top layer to provide conductive routing pathways is disclosed. The method and system include inputting predefined criteria for the via mesh, and configuring feasible straps in the bottom layer of straps using a set of predefined rules and configuring feasible straps for the top layer, and optionally the intermediate layers using the set of predefined rules. The predefined criteria preferably includes one or all of: defining the bottom and top layer connection locations, defining a set of predefined tracks for each layer, defining the number of layers and straps in each layer, and combinations thereof.

20 Claims, 3 Drawing Sheets

(56) References Cited

U.S. PATENT DOCUMENTS

| | | | |
|---|---|---|---|
| 2015/0004813 A1* | 1/2015 | Heppner | H01R 43/24 |
| | | | 439/81 |
| 2015/0170996 A1 | 6/2015 | Altabella Lazzi et al. | |
| 2015/0234269 A1* | 8/2015 | Azpiroz | G03F 1/76 |
| | | | 430/5 |
| 2017/0323481 A1* | 11/2017 | Tran | G06T 19/006 |
| 2019/0014884 A1* | 1/2019 | Fu | A45D 44/005 |
| 2019/0035159 A1* | 1/2019 | Tran | G06F 3/013 |
| 2019/0289986 A1* | 9/2019 | Fu | G06K 9/00268 |

\* cited by examiner

CONSTRUCTING VIA MESHES FOR HIGH PERFORMANCE ROUTING ON SILICON CHIPS

BACKGROUND

The present invention relates to integrated circuits, including Very Large Scale Integration (VLSI) silicon chips, and methods and systems for routing signals and voltages to and from the silicon chip, including systems and methods for configuring and/or constructing routing pathways to and from silicon chips.

With recent advancement of information technology and wide use of the Internet to store and process information, more and more demands are placed on the acquisition, processing, storage, and dissemination of information by information handling systems, e.g., computing systems. Information handling systems are being developed to increase the speed at which they are able to execute increasingly complex applications for business, personal use, and entertainment. Overall system performance is affected by each of the key elements of the information handling system, including the performance/structure of the integrated circuits or chips, processors, any memory devices or caches, input/output (I/O) subsystems, efficiency of the memory control functions, any associated memory interface elements, and the type and structure of the circuit interconnect interfaces.

The constantly increasing speed of information handling systems which execute increasingly complex applications places more rigorous performance demands on the multitude of integrated circuits or chips forming the circuitry in such systems. One manner to handle the increasing demands on such systems and circuitry has been the development of integrated circuits, and in particular Very Large Scale Integration (VLSI) silicon chip modules or packages. As VLSI increases silicon chip performance, the number of connections to the VLSI chip has increased such that a significant amount of routing resources are used to provide various signal connections to the VLSI chip as well as to provide power to the VLSI chip. Newer VSLI integrated circuits and chips are limited by routing resources (routing of signals and power), and the time and expenses of configuring the routing and numerous interconnections.

Computing demands require the ability to access an increasing number of higher density devices at faster and faster access speeds. Extensive research and development efforts are invested by the industry to create improved and or innovative solutions to maximize overall chip performance by improving the design, structure, and/or the methods by which integrated circuits, including VLSI chips, and/or modules are made and operate. To manufacture sufficiently small structures in integrated circuits, chips, and/or modules, self-aligned double patterning (SADP) technology was developed. As device scaling continues to facilitate increases in the number of devices, e.g., transistors, per unit area on the silicon chip, the requirements for routing signals and power need to be addressed.

SUMMARY

The summary of the disclosure is given to aid understanding of integrated circuits, including VLSI silicon chips and/or modules and packages containing integrated circuits, their architectural structure, and their method of operation and fabrication, including the construction, configuration, and design of routing signals and voltages in such circuits and chips, including circuits and chips using VLSI technology, and not with an intent to limit the disclosure or the invention. The present disclosure is directed to a person of ordinary skill in the art. It should be understood that various aspects and features of the disclosure may advantageously be used separately in some instances, or in combination with other aspects and features of the disclosure in other instances. Accordingly, variations and modifications may be made to the integrated circuits, VLSI silicon chips, modules, packages, architectural structure, and/or method of fabrication, including method and system of constructing via meshes, to achieve different effects.

A method for configuring a via mesh of a semiconductor circuit having a plurality of layers of conductive straps is disclosed where the via mesh includes at least a bottom layer formed of a plurality of parallel conductive straps, a top layer formed of a plurality of parallel conductive straps, and optionally one or more intermediate layers of conductive straps, one or more of the conductive straps in the bottom layer interconnected, directly or indirectly, by vias to one or more of the conductive straps in the top layer to provide conductive routing pathways. The method in an embodiment includes inputting predefined criteria including at least one of the group consisting of: defining the bottom layer connection locations, defining the number of layers in the resulting via mesh, defining a set of predefined tracks oriented in a set direction for each layer, defining the number of straps in each layer, defining the top layer connection locations, and combinations thereof. The method in an aspect also includes configuring the bottom layer of straps using a set of predefined rules to determine the feasibility of such straps in the bottom layer, configuring the top layer of straps using the set of predefined rules to determine the feasibility of such straps in the top layer, and optionally configuring one or more intermediate layers of straps using the set of predefined rules to determine the feasibility of such straps in the one or more intermediate layers. The predefined criteria in one or more embodiments includes defining a set of predefined tracks oriented in a set direction, and the method further includes in an aspect selecting one of the set of predefined tracks and searching one predefined track after another until a wire track feasible for a strap is selected. The set of predefined rules in an embodiment is applied to the selected track to configure a feasible strap.

A system for configuring a via mesh for a semiconductor circuit having a plurality of layers formed of conductive straps is also disclosed. The system in an embodiment includes memory configured to store predefined criteria and a set of predefined rules, where the predefined criteria includes at least one of the group consisting of: defining bottom layer connection locations, defining a number of layers in the resulting via mesh, defining a set of predefined tracks oriented in a set direction for each layer, defining a number of straps in each layer, defining top layer connection locations, and combinations thereof. In one or more aspects the system has a processor configured and adapted to: configure the bottom layer of straps using the set of predefined rules to determine the feasibility of such straps in the bottom layer; configure the top layer of straps using the set of predefined rules to determine the feasibility of such straps in the top layer; and optionally configure one or more intermediate layers of straps using the set of predefined rules to determine the feasibility of such straps in the one or more intermediate layers. The predefined criteria in an aspect includes defining a set of predefined tracks oriented in a set direction, and the system further comprises the processor configured to select one of the set of predefined tracks and search one predefined track after another until a wire track feasible for a strap is selected, and in an aspect, the processor optionally is configured to apply the set of predefined rules to the selected track to configure a feasible strap. In a further embodiment, in response to configuring all the feasible conductive straps for the bottom layer, the system proceeds to configure the straps of another layer, wherein the bottom layer of conductive straps is the lowest level of the via mesh, and the another layer of straps is adjacent and above the bottom layer.

In another embodiment, a computer program product for configuring a via mesh of a semiconductor circuit having at least a plurality of layers of conductive straps is disclosed. The computer program product in one or more aspects has a memory configured to store predefined criteria and a set of predefined rules, where the predefined criteria includes at least one of the group consisting of: defining the bottom layer connection locations, defining the number of layers in the resulting via mesh, defining a set of predefined tracks oriented in a set direction for each layer, defining the number of straps in each layer, defining the top layer connection locations, and combinations thereof. The computer program product further includes a processor and a non-transitory computer-readable storage medium comprising program instructions that when executed by the processor cause the processor to configure the bottom layer of straps using the set of predefined rules to determine the feasibility of such straps in the bottom layer, configure any intermediate layer of straps using the set of predefined rules to determine the feasibility of such straps in the intermediate layer; and configure a top layer of straps using the set of predefined rules to determine the feasibility of such straps in the top layer.

BRIEF DESCRIPTION OF THE DRAWINGS

The various aspects, features, and embodiments of integrated circuits, VLSI silicon chips, VLSI chip module/packages, architectural structures, and methods and systems for constructing via meshes will be better understood when read in conjunction with the figures provided. Embodiments are provided in the figures for the purpose of illustrating aspects, features, and/or various embodiments of the integrated circuit, VLSI chip, VLSI chip module/package, architectural structure, and methods and systems for fabricating via meshes, e.g., to provide routing pathways for signals and voltages in the integrated circuit, but the claims should not be limited to the precise arrangement, structures, features, aspects, embodiments, methods, devices, and/or systems shown, and the arrangements, structures, subassemblies, features, aspects, embodiments, methods, devices and/or systems shown may be used singularly or in combination with other arrangements, structures, subassemblies, features, aspects, embodiments, methods, devices, and/or systems.

DETAILED DESCRIPTION

Figure 1:
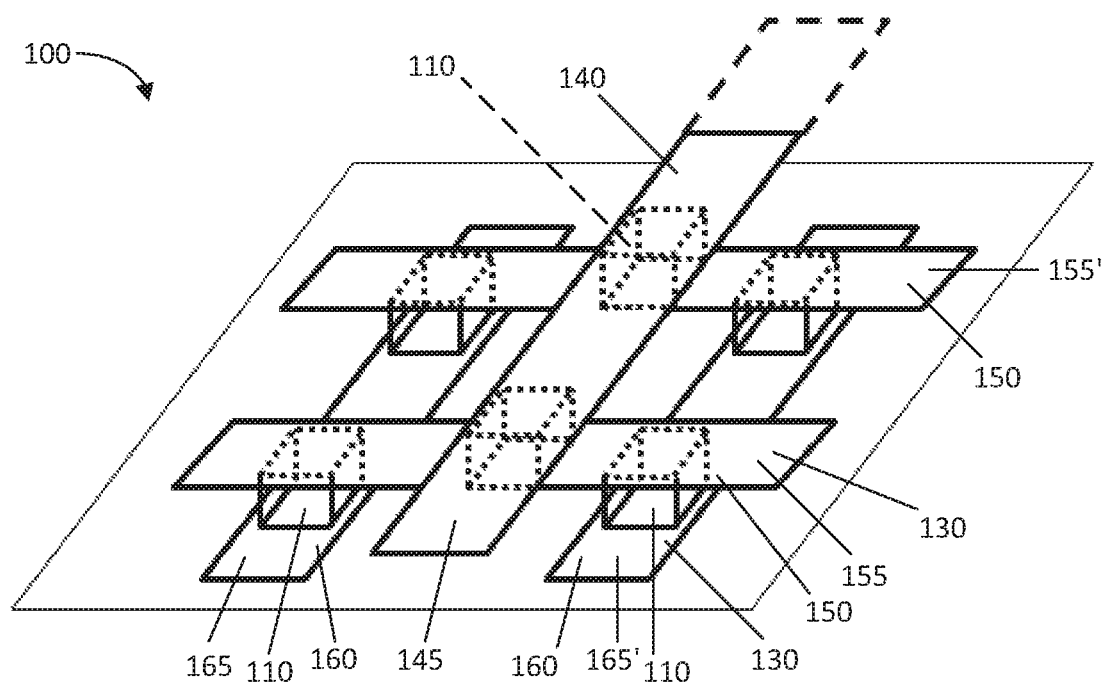
FIG. 1 depicts a top perspective view of an embodiment of a schematic representation of a via mesh.

The following description is made for illustrating the general principles of the invention and is not meant to limit the inventive concepts claimed herein. In the following detailed description, numerous details are set forth in order to provide an understanding of integrated circuits, VLSI chips, and via meshes, their architectural structure, and their method of fabrication, including methods and systems of designing and configuring via meshes, however, it will be understood by those skilled in the art that different and numerous embodiments of the integrated circuit, VLSI chip, VLSI chip module/package, architectural structure, system, and method of fabrication including designing and configuring via meshes may be practiced without those specific details, and the claims and invention should not be limited to the embodiments, subassemblies, systems, structures, features, processes, methods, aspects, and/or details specifically described and shown herein. Further, particular features described herein can be used in combination with other described features in various possible combinations and permutations.

Unless otherwise specifically defined herein, all terms are to be given their broadest possible interpretation including meanings implied from the specification as well as meanings understood by those skilled in the art and/or as defined in dictionaries, treatises, etc. It must also be noted that, as used in the specification and the appended claims, the singular forms "a," "an" and "the" include plural referents unless otherwise specified and that the terms "comprises" and/or "comprising" specify the presence of stated feature, integers, steps, operations, elements, and/or components, but do not preclude the presence or addition of one or more features, integers, steps, operations, elements, components, and/or groups thereof.

One area where integrated circuits, and particularly VLSI chips and/or modules, are used is in the many circuits and systems utilized in computing or data processing systems. The computing systems may take many forms and the VLSI chips or modules in an embodiment may include one or more processors, Random Access Memory (RAM) modules, nonvolatile memory, devices, device specific circuits, I/O interfaces, and I/O devices and peripherals.

Integrated circuits, including VLSI circuits, are fabricated on a thin silicon wafer, also referred to as a silicon substrate. VLSI process technology fabricates circuits on the silicon substrate or wafer. In an embodiment, an integrated circuit includes a silicon chip having voltage connections and signal connections. A silicon chip module/package includes transistors, diodes, resistors, capacitors and other devices, e.g., the chip devices and circuitry, formed in the silicon substrate, and then thin metal layers or straps with insulating layers there between are formed on the silicon substrate. Power and signals are delivered or routed to the circuitry (e.g., transistors, diodes, resistors, capacitors, etc.) in silicon substrate through the stack of metal layers. These metal layers and the routing pathways formed therein are sometimes referred to as wires or wiring. In an embodiment, the metal layers above the silicon substrate, and in aspects the first couple of layers above the silicon substrate, may utilize self-aligned double patterning (SAPD) technology. SAPD technology uses width spacing patterns (WSPs) which define the number and width of the wires. There are drawbacks associated with SAPD technology, including, for example, the routing space required by wide wires (e.g., wide WSPs), and for various reasons it may be advantageous to use via meshes as a means to reach higher layers, including, but not limited to, using via meshes on SAPD layers.

In one or more embodiments, the silicon chip includes a silicon substrate having circuitry formed therein, and a via mesh formed on the surface of the silicon substrate. Additional metal layers and wiring may be formed above the via mesh, for example wiring using SAPD technology. The via meshes comprise one or more metal layers, typically formed on the surface of the silicon substrate, and one or more conductive via structures between the metal layers to form connection pathways between the metal layers. The metal layers are formed of multiple adjacent metal straps. The straps on each layer are all oriented and run in the same direction and adjacent layers have the straps oriented in different directions, preferably perpendicular or orthogonal to each other. One or more vias provide signals and voltage to the desired nodes (connection points) in the top metal layer down to the pins (connection locations) in or adjacent to the silicon substrate. In an embodiment, a via mesh is configured so that a plurality of signal routing pathways are formed from the top metal layer to the circuitry in the silicon substrate, and a plurality of voltage routing pathways are formed from the top metal layer to the circuitry in the silicon substrate. In an embodiment, a via mesh is formed to provide a signal routing network (e.g., multiple conductive pathways) from one or more first points or connection locations (also referred to as nodes) in a first layer to one or more second connection points or locations (also referred to as pins) in a second layer.

FIG. 1 shows a top perspective view of a schematic illustration of a portion of via mesh 100 which has three metal layers. Via mesh 100 is a mesh formed of multiple connected vias 110 and straps/strips 130 that form one or more conductive pathways from one or more nodes, e.g., connection locations, associated with a top strap layer 140 to one or more pins, e.g., connection locations, associated with the bottom strap layer 160. More specifically, each layer 140, 150, 160 has one or more, and preferably numerous, parallel, closely spaced, straps or strips 130 all oriented in the same direction in each respective layer. Adjacent layers of straps run in a different direction than, and preferably perpendicular (orthogonal) to, the adjacent layers, i.e., the layers above and below the subject layer. In FIG. 1, straps 165, 165' of bottom layer 160 are oriented perpendicular to straps 155, 155' of first intermediate layer 150, and in the same direction as strap 145 in top layer 140.

Each strap 130 is connected by one or more vias 110 to an intersecting strap (or pin shape) 130 below, e.g., on a lower layer. The vias 110 provide a conductive path between the layers of straps 130 to form a conductive pathway from the top layers down to lower layers, preferably the bottom layer that preferably connects to the silicon substrate at connection points or pins (also referred to as pin shapes). Two via structures 110 (shown in phantom lines in FIG. 1) are below top strap 145 and interconnect strap 145 to lower level straps 155, 155'. Two via structures 110 (shown in partial phantom lines in FIG. 1) connect each respective intermediate straps 155, 155' to both bottom layer straps 165, 165'. Straps 130 in the metal layers are connected together using a series of via structures 110 to ensure good connectivity and provide signal or power routing pathways to the silicon substrate. The conductive routing pathways formed by the interconnected straps and via structures are sometimes referred to as wires and/or wiring. These conductive routing pathways form signal routing pathways that serve to route data signals, control signals, and other signals to the circuitry in the silicon substrate. Different conductive routing pathways form conductive power routing pathways to form a power grid to provide power to the circuitry in the silicon substrate.

It will be appreciated that FIG. 1 has been simplified for ease of illustration. While FIG. 1 only shows first intermediate layer 150, it will be appreciated that via mesh 100 may include several intermediate layers between top strap layer 140 and bottom strap layer 160. In addition, while layers 150 and 160 have each been shown with two straps, and top strap layer 140 has been shown with only one strap 145, it will be appreciated that each of the layers 140, 150, and/or 160 of via mesh 100 typically has numerous straps. Each layer of a via mesh may have approximately one to eight straps, although other amounts of straps are contemplated. Furthermore, the straps 130 are typically not only more numerous than illustrated, but have a width of one to five times the minimum allowed wire width, and have varying lengths which may be as long as the diameter of the bounds of the electrical circuit of the pin. The spacing between adjacent straps is also very small, typically on the order of the minimum allowed wire width. The distance between the straps/wires and the sizes of the straps are getting smaller with each new generation of silicon chips.

The via mesh 100 preferably provides low resistance connections from one or more pins or pin shapes in the silicon substrate (or lower layers adjacent or proximate the silicon substrate) to upper layers, e.g., to nodes in the upper layer. Minimum width straps (wires) can be used in the layers and wide width wires associated with SADP technology can be avoided. The via mesh 100 can also save signal and power routing pathway space.

In an embodiment, a method and system to provide signal (and power) connections to an integrated circuit, including VLSI silicon chips, is disclosed. In one or more embodiments, a method and system for configuring a via mesh to provide signal and power in a silicon chip, including VLSI silicon chip modules, is disclosed. In an embodiment, the system provides a method, structure, and architecture for configuring and/or constructing a via mesh and in an aspect replacing wire routing networks with via meshes. In an aspect, the system and method includes replacing one or more layers of conductive pathway routing, including one or more layers of routing using SADP technology, including SADP technology having a set of defined width spacing patterns (WSPs), with a via mesh. In an embodiment, the method and/or system includes forming a via mesh that provides low resistance connections from pin(s), e.g., pin shapes, adjacent to, at, or in the silicon substrate to upper metal layers.

Disclosed is a method and system of configuring and/or constructing a via mesh of a semiconductor circuit comprising at least one strap for electrically interconnecting one or more conductors positioned and extending in an adjacent layer. In an embodiment, the method and system of constructing, generating, and/or configuring a via mesh is automated wherein the at least one strap is configured and/or constructed based upon one or more input or predefined criteria and application of one or more constraints, rules, logic, and/or guidelines. In one or more embodiments, the via mesh is generated and/or configured by configuring the straps in a layer one layer at a time by applying one or more constraints, rules, logic, and/or guidelines in a reiterative process to configure the straps in each layer of the via mesh. In an embodiment, the method and/or system replaces conductive routing pathways that do not utilize via meshes, e.g., SADP technology that use a set of wide space patterns (WSPs), with a via mesh.

In one or more embodiments, there are one or more inputs or predefined criteria for configuring the via mesh. In one or more embodiments, the input(s) or predefined criteria to the method and/or system for configuring a via mesh includes a silicon substrate having known circuitry and/or a set of WSPs used for the first several, e.g., one to three, layers above the silicon substrate that are to be replaced by a via mesh. In one or more embodiments, the pin configuration, e.g., the connection locations, of the lower layer, preferably connecting to the silicon substrate, is known. That is a set of pin shapes and/or connection locations on the layer under the via mesh is known. In one or more embodiments, the node connection points (connection locations) with the layer above the via mesh is known. In an example, the target top layer of the via mesh has one or more known nodes or connection points to which the via mesh needs to make electrically conductive connections. For example, in an embodiment, the pin connections (e.g., the target locations) to which the lower layer in the via mesh makes connections and the node connections (e.g., target locations) to which the upper layer of the via mesh makes connections are known inputs or predefined criteria.

Further inputs or predefined criteria to the method and/or system for configuring a via mesh in one or more embodiments includes the number of conductive metal layers in the via mesh. Additionally, and/or alternatively, the number of straps to be constructed and/or configured on a layer is known and an input to and/or predefined criteria for the method and/or system. Preferably, the number of straps needed for one or more layers, preferably the number of straps needed for each layer are predefined criteria and/or inputs for the system and/or method of constructing and/or configuring a via mesh. In one or more embodiments, the width of the straps may be predefined criteria and can not be changed. In one or more embodiments, the width of the straps is dependent upon the electrical properties of the straps. The width of the straps is often predefined by the wires in the layers above the via mesh, and often by the width of the WSPs used in the upper layers formed by SAPD technology.

Further inputs or predefined criteria to the method and system for configuring a via mesh in one or more embodiments includes a predefined set of wire tracks for one or more layers of the via mesh, and preferably each layer of the via mesh. In an embodiment, a track is a possible location of the strap, e.g., a location where a strap can be configured and formed in the layer. A strap can be the entire length of the track, or more likely a part or portion of the track, and in an embodiment, a strap is the entire actual track chosen, or only a portion of the actual track chosen. In other words, a strap is typically a segment of one of the tracks. In one or more embodiments, the tracks (and/or straps) of a layer are defined to run or be oriented in a certain direction, and typically and preferably, the tracks and straps of adjacent layers in a via mesh are orthogonal to each other.

In one or more embodiments, the tracks are predefined criteria. For example, the width of the straps and the spacing distance between the straps may be predefined, which defines the width and spacing of the wire tracks from which the straps are formed. The spacing between the wire tracks and/or straps may be dependent upon the technology used to form the tracks/straps, as well as a function of the signals/power transmitted by the straps. The orientation or direction of the wire tracks (straps) may also be predefined. Predefining these variable or constraints for the possible wire tracks from which the straps are formed may predefine and/or at least restrict the various possible locations for the tracks. Predefining, the width, direction of, and spacing between the tracks may leave only a set number of tracks for that layer of the via mesh. In an aspect, the actual location, direction, width, and spacing of the tracks are predefined criteria and would be input into the system and/or process.

In one or more embodiments, existing wires and blockages are treated as inputs and/or predefined criteria for the method and/or system. For example, existing power routing and pre-routed signal nets are known. Additional optional constraints on the via mesh can be further inputs and/or predefined criteria for the method and/or system. For example, one or more target regions can be defined for one or more top straps.

One or more of various rules, principles, and/or guidelines are used to create, configure, formulate and construct a via mesh, preferably a via mesh that has a small footprint (is compact) and is power efficient. Preferably, the via mesh configured using the method and/or system has a smaller footprint and is more power efficient than the circuit and/or wiring (WSPs) that it replaces. The via mesh, configured and/or constructed by the method and/or system, should present a feasible solution. For example, the via mesh should pass and/or meet the design rule checker (DRC) so that the shapes of the conductive routing pathways are manufacturable, and meet wire/strap distance criteria (e.g., straps are sufficiently spaced from each other on the layer). For example, when configuring a strap for a conductive metal layer from a potential track, the distance between adjacent straps already configured during the process, can not violate design criteria on the minimum spacing for conductive straps.

As another example of design principles and rules applied while configuring the wire straps, the conductive pathways formed in the via mesh should be conflict free of each other, and to neighboring via meshes. That is the various straps formed in the via mesh, and on each layer of the via mesh, can not conflict with each other. For example, if one or more straps have already been configured and/or constructed on a layer of the via mesh, the method and/or system can not configure a later strap on that layer to conflict with (overlap in the same space as) the earlier configured strap. Other principles and/or rules to apply when configuring and/or constructing the via mesh is that the conductive routing pathways formed by the via mesh should not create shorts, the wires/straps should maintain a predefined distance from each other, and should not use space used by other straps. The via mesh formed by the process and/or system should be routable and provide a conductive pathway between desired pins and/or nodes. The conductive routing pathway in the via mesh should be small and be within the defined space for the via mesh. The conductive routing pathways in the resultant via mesh should also not cause delay in routing signals and/or power.

Figure 2:
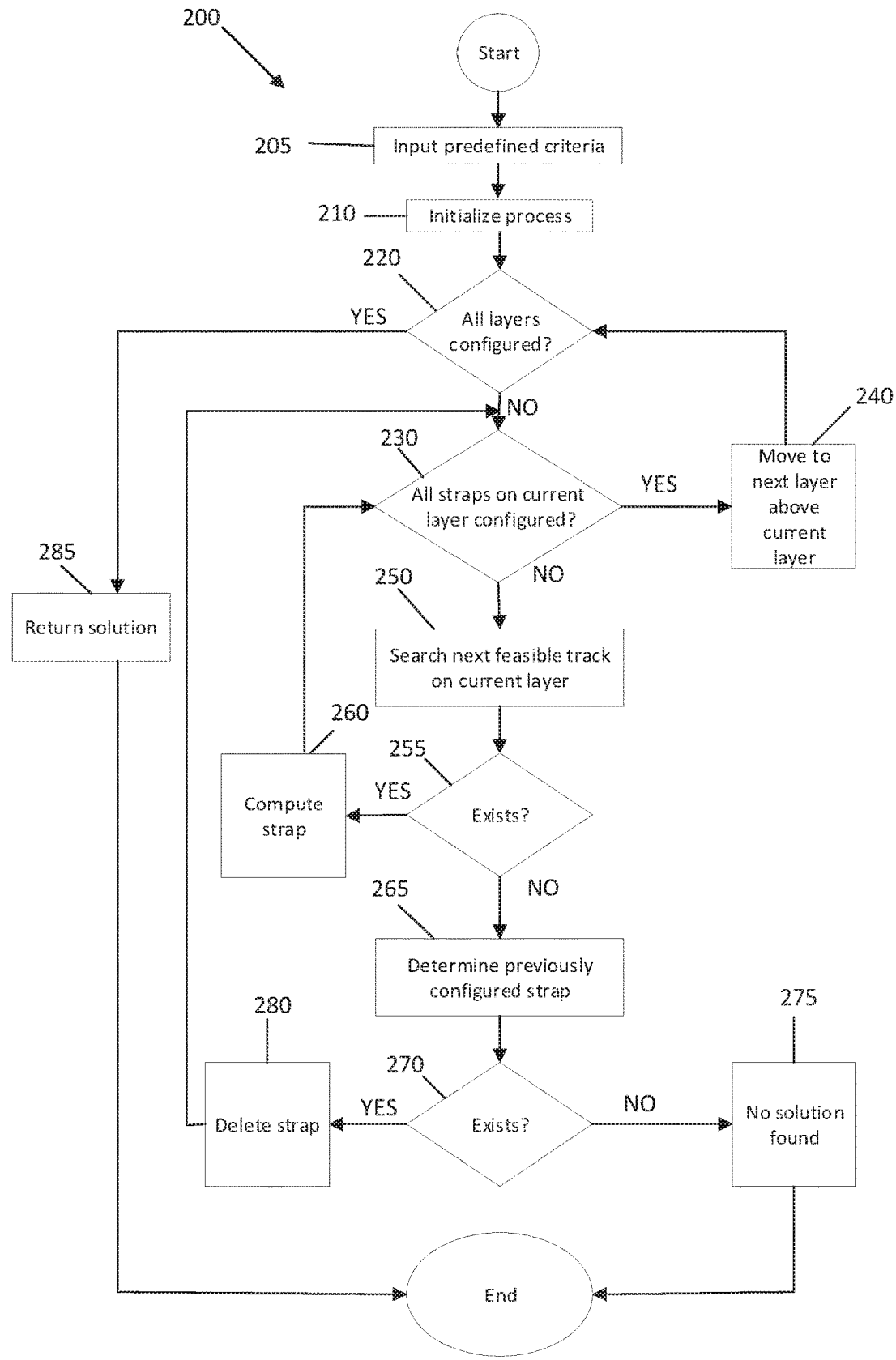
FIG. 2 depicts a flow chart of a method of configuring and/or constructing a via mesh for an integrated circuit.

FIG. 2 is an exemplary flowchart in accordance with one embodiment illustrating and describing a method of configuring, generating, and/or constructing a via mesh, including configuring a via mesh to replace existing conductive pathway routing associated with a silicon chip, preferably a VSLI silicon chip. While the method 200 is described for the sake of convenience and not with an intent of limiting the disclosure as comprising a series and/or a number of steps, it is to be understood that the process does not need to be performed as a series of steps and/or the steps do not need to be performed in the order shown and described with respect to FIG. 2, but the process may be integrated and/or one or more steps may be performed together, simultaneously, or the steps may be performed in the order disclosed or in an alternate order.

In an embodiment, the method 200 of configuring, generating, and/or constructing the via mesh may be formed by an automated process, and in an embodiment a computer generated process using a reiterative process to configure, generate, and/or construct metal straps in the layers of the via mesh connectable by via structures that provide feasible routing pathways between pins in a silicon substrate and nodes in a top target layer. In an embodiment of the method 200, at 205, the predefined or input criteria is selected and/or input into the system and/or automated process. In an embodiment, the input criteria can be programmed or otherwise put into the system. The input criteria in one or more embodiments may include one or more of, preferably all of, the following: defining the location of the set of pin shapes or connections on the lower (first) layer; defining the set of nodes or connections on the top target layer; defining the number of layers in the via mesh; defining the set of tracks on each layer; and/or defining the number of straps needs for each layer of the via mesh. In an embodiment, defining the set of tracks, e.g., defining an ordered set of tracks, on each layer, includes defining or setting an the location of each track on the layer, and in an aspect includes defining and/or setting one or more of, preferably all of, the orientation, width, spacing, and the number of tracks on each layer.

At 210 the method is initialized and in an embodiment the current layer of the via mesh to be configured and/or constructed is set, and in an embodiment, the method and/or system initializes and sets or starts with the lowest via mesh layer. In an embodiment, the process starts at the pin layer of the via mesh. The method 200 then proceeds to determine at 220 whether all the layers of the via mesh have been configured, designed, formulated, and/or constructed. If at 220 not all the mesh layers have been configured and/or constructed (220: No), then the process continues to 230.

At 230, method 200 determines whether all the straps on the current layer have been configured and/or constructed. If at 230, all the straps on the current layer have been configured and/or constructed (230: Yes), then the process 200 continues to 240 where the process 200 moves to the next layer and loops back to block 220 where the process determines whether all layers of the via mesh have been configured and/or constructed.

If at 230 not all the straps for the current strap layer have been configured and/or constructed (230: No), then method 200 continues to 250. At 250 the method searches for the next feasible track on the current layer. At 250 the method applies various rules and/or principles to determine and search for a feasible track on the current metal layer. In an embodiment, a track is a possible location of the strap, e.g., a location where a strap can be configured and formed in the layer. In one or more embodiments, the tracks of a layer are predefined. In other words, there is an ordered set of tracks for the layer, and preferably for each layer, to be configured. For example, the tracks are defined to run or be oriented in a certain direction, and typically and preferably, the tracks of adjacent layers in a via mesh are orthogonal to each other. In one or more embodiments, the width, direction of, and spacing between the tracks are predefined, and in an aspect, the actual location, direction, width, and spacing of the tracks are predefined and the method and/or system selects a strap to be configured on the layer and searches for a feasible track for that strap on the current layer.

The process 200 continues after 250, i.e., searching for a feasible track on the current layer, to 255. Process blocks 250 and 255 are closely related and may be considered a single process block. At 255, it is determined whether a feasible strap on the current layer exists. The process of 250 and 255 of searching and/or determining whether a track is feasible and/or a feasible strap exists includes in an embodiment applying one or more rules, guidelines, logic, and/or principles. For example, a track is not feasible if the space is used by another strap, and/or if a via cannot be dropped to a lower adjacent layer and/or strap at the desired location or locations. Other rules, logic, guidelines, and/or principles to apply include checking to see if the track and/or strap would violate design rule checker (DRC) rules, violate strap distance rules, and/or create shorts with straps already configured and/or computed. In addition, design rules to apply when configuring straps include avoiding neighboring via meshes, avoiding blockages, and checking to see whether the straps are manufacturable, e.g., insuring that the router can manufacture the strap. As will be explained in greater detail below, rules for searching for, determining, and/or configuring (computing) a feasible track and/or strap can be prioritized, and/or used to speed up the process of configuring the feasible straps.

If a feasible track and/or strap on the current layer exists (255: Yes), then the process continues to 260 where a strap is configured and/or computed. The strap for example may be shorter than the track selected, and thus the coordinates defining the strap will be computed. In one or more embodiments, after the strap is configured and/or computed, the coordinates of the strap are saved. So for example, in an embodiment, the process and/or system includes selecting a strap to be configured, selecting a track out of a set of predefined tracks which may be feasible, and applying a set of rules, guidelines, logic, and/or principles to determine whether the selected track provides a feasible solution for the strap being configured, and then at 260 configuring or computing the strap. After 260, where the strap is configured and/or constructed, the process 200 continues to 230 where it is determined whether all the straps on the current layer have been configured and/or constructed. If at 230, not all the straps have been configured and/or constructed on the layer, then the process continues to 250 and the process of selecting and configuring the next strap on the layer is repeated until all the straps on a layer have been configured. More particularly, the process would select a track for the next strap to be configured and apply all the various rules and/or constraints to determine, configure, and/or compute the next feasible strap, and optionally save the coordinates of the strap, and all the straps on the layer. The number of straps required for each layer is typically predefined input criteria and is generally a function of the number of routing pathways necessary to configure from the top layer of the via mesh down to the lowest layer of the via mesh. Accordingly, the number of straps to configure, compute, and/or construct for a layer is generally known, and if all the straps on the current layer have been configured and/or constructed (230: Yes), then the process continues to 240 where the process continues to the next layer of the via mesh to be configured. Typically the process after configuring, computing, and/or constructing a layer of straps the process continues to the layer above the layer that was just completed.

After 240 where all straps on a current layer are configured and the process moves to the next layer of straps above the current layer, the process continues to 220. If at 220 the straps in the next layer have not been configured, computed, and/or constructed the process continues and repeats processes 230, 250, 255, and 260 until all the layers of the via mesh have been configured (220: Yes), then the process 200 continues to 285 where a solution for the via mesh has been computed and the process stops. The number of layers in the via mesh to be computed is typically a known input.

There may be circumstances and situations where a feasible strap can not be configured, computed, and/or constructed on a particular layer for a via mesh. If at 255, the next feasible strap does not exist (255: No), then process 200 continues to 265 and 270 where the process looks for and finds the previously built strap, if it exists. More specifically, in an embodiment, the process at 265 determines (looks up from storage) the previously built strap, and at 270 determines whether such strap exists. If no previously built strap exists (270: No), then the process continues to 275 where it is determined that no solution exists and the process ends. If at 270 it is determined that there was a previously configured, computed, and/or built strap (270: Yes), then the process 200 continues to 280 where the previously configured strap is deleted and the process continues to 230 where it is determined (with the previous strap deleted) whether all straps on the current layer are configured (which typically should be answered in the negative (230: No) since the previous strap was deleted) and the process 200 continues by trying a new configuration/location for the previously deleted strap in order to find a feasible solution for that strap. In other words, the process ignores the last strap location and configures a different location for that deleted strap. In one or more embodiments, that previously used strap coordinates are saved, and in an aspect the deleted strap (location) for that particular strap is marked unusable.

The process for example, after deleting the previously determined feasible strap, then determines whether another feasible track and/or strap solution exists for the deleted strap, and then determines whether a feasible track and/or strap solution exits for the strap that previously did not have a feasible solution. The process will continue deleting and trying new track locations and strap configurations until a feasible solution is found for all straps on all layers of the via mesh.

In the process 200 of FIG. 2, rules and/or logic can be used to prioritize the location of straps in the layer. The rules and/or logic to prioritize the location of the straps, in an embodiment, can be configured to select tracks closer to the center of bounding pins and/or lower level connecting straps. For example, tracks can be sorted and/or selected based upon the distance of the track coordinates to the center coordinates of the bounding box of pins. For example, by reference to FIG. 1, which shows upper strap 145 centered between straps 155, 155', the process can prioritize use of tracks and/or straps that are centered between the lower level of connecting straps. That is in the process of configuring a strap on a layer, the process can start by selecting one or more of the centralized tracks to determine if a feasible strap can be configured based upon the centralized tracks.

Figure 3A:
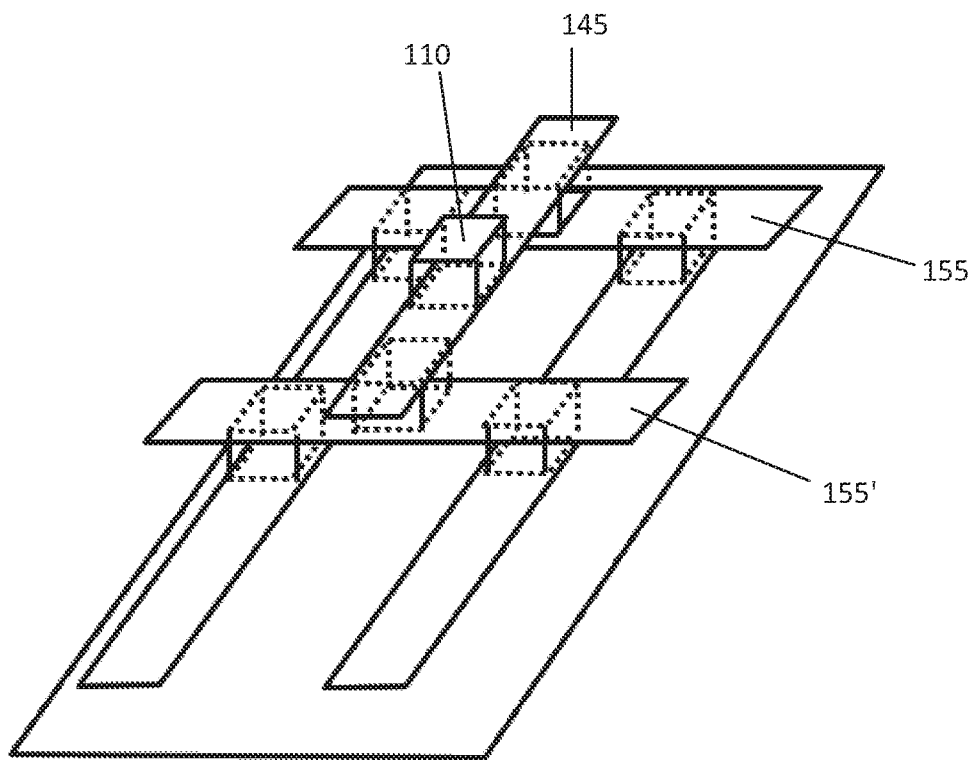
FIG. 3A depicts a top perspective view of an embodiment of a schematic representation of a portion of a via mesh.
Figure 3B:
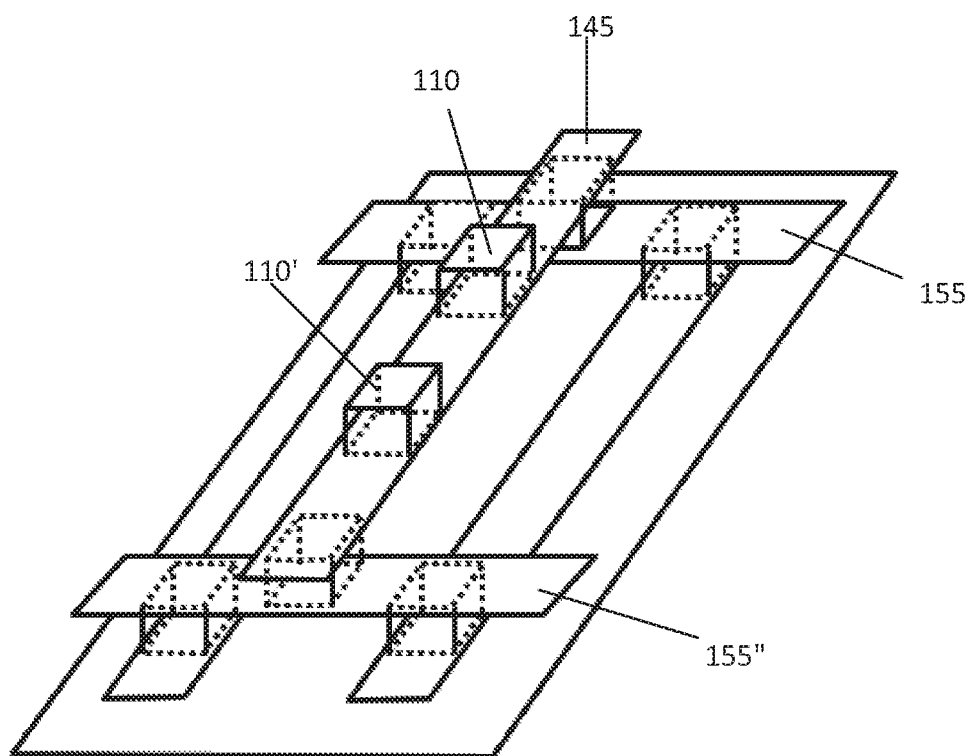
FIG. 3B depicts a top perspective view of another embodiment of a schematic representation of a portion of a via mesh.

In an embodiment, the method and/or systems uses rules and/or logic to speed up finding, configuring, and/or constructing a via mesh. For example, in an embodiment, partial solutions that cannot be completed will be dropped so time will not be wasted computing such straps. In one or more embodiments, tracks of a strap that would violate via distance rules will not be used, and computing straps using tracks that violate such rules will be dropped from consideration. For example, when checking whether a track and/or strap is feasible for a first layer, e.g., a lower level strap, check if sufficient number of vias with sufficient spacing can be placed on that first layer strap, e.g., lower layer strap, to make connection to a strap located on the layer above that lower level strap. In an example, as shown in FIGS. 3A and 3B, configuring and/or constructing strap locations that are spaced further apart increases the number of vias that are possible and will facilitate configuration and/or construction of straps that will provide a feasible via mesh and should be prioritized. That is the method and system in an embodiment first will select track locations and/or straps that are spaced further apart and/or increases the number of possible vias. In FIG. 3A only one via 110 is possible on strap 145 because of the spacing of straps 155, 155' on the lower layer, while FIG. 3B shows a solution where two vias 110, 100' would be possible on strap 145 because of the larger spacing between adjacent straps 155, 155" on the lower metal layer. Increasing the number of possible vias increases the likelihood that a feasible upper layer strap can be configured and/or constructed so in embodiments spreading the distance of underlying straps to increase the number of possible vias is preferred, and a track location and/or strap configured and constructed as in FIG. 3B will be prioritized and selected first and/or over possible other tracks and/or straps.

In one or more embodiments, there will be circumstances where no feasible via mesh for the given pin and node connections with the required amount of straps can be configured and/or constructed. In one or more such circumstances, a partial via mesh, e.g., a via mesh with less than the required number of straps can be configured, constructed, and/or created. To achieve such partial via meshes, the process can be facilitated by saving, each time when the first strap on a layer is configured and/or created, the locations (the coordinates) of all the straps of the current partial mesh. In an embodiment, when there is not a feasible track and/or strap that can be created and the process returns no solution found, e.g., the process proceeds to 280 and/or 275, then in an aspect the partial via mesh is restored using the saved strap locations.

Aspects of the present invention are described herein with reference to flowchart illustrations and/or block diagrams of methods, and apparatus (systems). It will be understood that each block of the flowchart illustrations and/or block diagrams, and combinations of blocks in the flowchart illustrations and/or block diagrams, can be implemented by circuitry, hardware, semiconductor processing, structures and/or techniques. The flowchart and block diagrams in the figures illustrate the architecture, functionality, and operation of possible implementations of systems, and methods, according to various embodiments of the present invention. In this regard, each block in the flowchart or block diagrams may represent a module, segment, circuitry, hardware, or portions of integrated circuits, silicon chips and semi-conductor instructions for implementing the specified function (s). In some alternative implementations, the functions noted in the block may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by other structures that perform the specified functions or acts. It will be clear that the various features of the foregoing systems and/or methodologies may be combined in any way, creating a plurality of combinations from the descriptions presented above.

An example of a method and system for constructing via meshes is described below with respect to pseudo code. The example is just one implementation and embodiment and should not be limiting. In accordance with the example, l refers to layers and j refers to tracks and/or straps. In one or more embodiments, there are one or more inputs into the method and system including:

Via mesh layers $\{1, \ldots, n\}$, pin layer 0, via mesh top layer n.

A set of pin shapes on layer 0
Ordered set of tracks T(l):={1, . . . , m(l)} for layer
    l=1, . . . , n, where l is layers
numStrapsNeeded(l) number of straps to built on layer l,
    1<=numStrapsNeeded(l)<=m(l) for l=1, . . . , n
The method and system is expected to have an output or
result of:
    for l=1, . . . , n: for j=1, . . . , numStrapsNeeded(1): s(l,j)
        in T(l) with properties below, where j is tracks/straps.
The guidelines, rules or properties for the straps include:
    Track s(l,j) legal for a strap, i.e. there is a strap which
        intersects strap on s(l−1,j) for all j=1, . . . , num-
            StrapsNeeded(l−1) if l>1.
        intersects each pinshape on layer 0 if l=1.
        is DRC clean (including via downs at intersections)
In this example s(l,j) is the track for strap j on layer l for
l=1, . . . , n and j=1, . . . , m(l).

```
s(l,j) := −1 for l=1,...,n and j=1,...,numStrapsNeeded(1)  // Track choosen
for strap j on layer l,
                                          initially unset
j(l) := 0 for l=1,...,n                   // Num straps built on layer l
l := 1
While l <= n                              // Process all layers
  while (j(l) < numStrapsNeeded(l))       // Not done yet with layer l
    If s(l,j(l)) != −1                    // Track already defined for strap j(l) on
                                          l, but no solution found yet
        delete strap j(l)                 // Delete strap j
        start := s(l,j(l))                // Remember last strap's coordinate
        s(l,j(l)) := −1                   // Mark strap j on layer l unset
    Else if j(l) > 0                      // No track defined yet for strap j on
                                          layer l, but it's not the 1st strap
        start := s(l,j(l)−1)              // Set start track to be the track of strap
                                          j(l)−1
    Else
        start := 0                        // No track defined yet for strap j on
                                          layer l. Strap is the 1st one on l
    Search next track t in T(l), start <t <= m(l) which is legal for a
    strap
    If such t exists
        create a minimum length strap j(l) legal on t  // Strap can be
legally built
        s(l,j(l)) := t                    // Remember track number for strap j(l)
        j(l) := j(l)+1                    // Go to next strap onlayer l
    Else if j(l) > 0                      // No legal track found for strap j(l), and
                                          it's not the 1st strap
        j(l) := j(l)−1                    // Go to previous strap
    Else if l > 0                         // No legal track found for strap j(l), 1st
                                          strap, but not first layer
        j(l−1) := j(l−1)−1                // Go to previous strap on layer below
        l := l−1                          // Go to layer below
        break
    Else
        Return false                      // No solution found
  l := l+1                                // Solution found for layer l, Go to layer
                                          l+1
Return true       // Feasible solution found
```

The descriptions of the various embodiments of the
present invention have been presented for purposes of
illustration, but are not intended to be exhaustive or limited
to the embodiments disclosed. Many modifications and
variations will be apparent to those of ordinary skill in the
art without departing from the scope and spirit of the
described embodiments. The terminology used herein was
chosen to best explain the principles of the embodiments, the
practical application or technical improvement over tech-
nologies found in the marketplace, or to enable others of
ordinary skill in the art to understand the embodiments
disclosed herein.

We claim:

1. A method for creating a via mesh of a semiconductor
circuit having at least a first layer formed of a plurality of
parallel conductive straps and a second layer formed of a
plurality of parallel conductive straps, one or more of the
conductive straps in the first layer interconnected by vias to
one or more of the conductive straps in the second layer to
provide conductive routing pathways, the method compris-
ing:
    inputting predefined criteria including defining the first
        layer connection locations, defining the number of
        layers in the resulting via mesh, defining a set of
        predefined tracks oriented in a set direction for each
        layer, and defining the second layer connection loca-
        tions;
    configuring a first layer of straps using at least in part the
        predefined criteria and a set of predefined rules to
        determine the feasibility of such straps in the first layer;
        and
    configuring a second layer of straps using at least in part
        the predefined criteria and the set of predefined rules to
        determine the feasibility of such straps in the second
        layer.

2. The method according to claim 1, wherein the pre-
defined criteria includes defining a set of predefined tracks
oriented in a set direction, and the method further comprises
selecting one of the set of predefined tracks and searching
one predefined track after another until a wire track feasible
for a strap is selected.

3. The method according to claim 2, wherein the set of
predefined rules are applied to the selected track to configure
a feasible strap.

4. The method according to claim 3, wherein the straps
that are not feasible are marked and saved.

5. The method according to claim 1, wherein after all the
feasible conductive straps for the first layer are configured
then the method proceeds to configure the straps of another
layer, wherein the first layer of conductive straps is the
lowest level of the via mesh, and the another layer of
conductive straps is adjacent and above the first layer.

6. The method according to claim 1, wherein the first layer
of conductive straps has predefined tracks that are oriented
orthogonal to the orientation of the next layer of conductive
straps having predefined tracks.

7. The method according to claim 1, wherein the set of
predefined rules includes at least one of the group of rules
consisting of defining the spacing between adjacent straps,
applying design rule checker rules, avoiding configuring
straps that would create a short circuit, avoiding using space
used by other straps, and combinations thereof.

8. The method according to claim 1, further comprising
configuring one or more additional layers of intermediate
straps located between the first and second straps using the
set of predefined rules to determine the feasibility of straps
in such one or more additional layers of intermediate straps.

9. The method according to claim 1, wherein the pre-
defined criteria further includes; predefining the number of
straps in each layer of the resultant via mesh.

10. The method according to claim 1, wherein in response
to configuring a layer of conductive straps, the method
prioritizes selecting a track that is centrally located above
the connecting straps of the lower layer.

11. The method according to claim 1, wherein in response
to configuring a layer of straps, the method prioritizes
selecting a track that maximizes the number of vias that can
contact the layer above the layer being configured.

12. The method according to claim 11, wherein the
method maximizes the spacing between adjacent straps.

13. The method according to claim 1, wherein the pre-
defined criteria includes defining a set of predefined tracks for each layer of the via mesh, and wherein configuring a first layer of straps includes searching from predefined tracks to find a feasible strap on the first layer, configuring the feasible strap and repeating the process until all straps of the first layer are configured, and then moving to the next layer.

14. The method according to claim 1, wherein the set of predefined rules includes at least one of the group consisting of: avoiding existing strips; avoiding short circuits; avoiding spacing restrictions; avoiding space used by other strips; and combinations thereof.

15. A system for creating a via mesh for a semiconductor circuit having a plurality of layers including at least a bottom layer formed of a plurality of parallel conductive straps and a top layer formed of a plurality of parallel conductive straps, one or more of the conductive straps in the bottom layer interconnected by vias to one or more of the conductive straps in the top layer to provide conductive routing pathways, the system comprising:
- memory configured to store predefined criteria and a set of predefined rules, wherein the predefined criteria includes defining bottom layer connection locations, defining a number of layers in the resulting via mesh, defining a set of predefined tracks oriented in a set direction for each layer, and defining top layer connection locations; and
- a processor configured to:
  - configure the bottom layer of straps using at least in part the predefined criteria and the set of predefined rules to determine the feasibility of such straps in the bottom layer; and
  - configure the top layer of straps using at least in part the predefined criteria and the set of predefined rules to determine the feasibility of such straps in the top layer.

16. The system according to claim 15, wherein the system further comprises selecting one of the set of predefined tracks and searching one predefined track after another until a wire track feasible for a strap is selected.

17. The system according to claim 16, wherein the set of predefined rules are applied to the selected track to configure a feasible strap.

18. The system according to claim 15, wherein, in response to the processor configuring all the feasible conductive straps for the bottom layer, the system proceeds to configure the straps of another layer, wherein the bottom layer of conductive straps is the lowest level of the via mesh, and the another layer of conductive straps is adjacent and above the bottom layer.

19. The system according to claim 15, wherein the set of predefined rules stored in memory includes at least one of the group consisting of: avoiding existing strips; avoiding short circuits; avoiding spacing restrictions; avoiding space used by other strips; and combinations thereof.

20. A computer program product for creating a via mesh of a semiconductor circuit having at least a plurality of layers of conductive straps including a bottom layer formed of a plurality of parallel conductive straps and a top layer formed of a plurality of parallel conductive straps, one or more of the conductive straps in the bottom layer interconnected by vias to one or more of the conductive straps in the top layer to provide conductive routing pathways, the computer program product comprising:
- memory configured to store predefined criteria and a set of predefined rules, wherein the predefined criteria includes defining the bottom layer connection locations, defining the number of layers in the resulting via mesh, defining a set of predefined tracks oriented in a set direction for each layer, and defining the top layer connection locations;
- a processor; and
- a non-transitory computer-readable storage medium comprising program instructions that when executed by the processor cause the processor to:
  - configure the bottom layer of straps using at least in part the predefined criteria and a set of predefined rules to determine the feasibility of such straps in the bottom layer;
  - configure any intermediate layer of straps using at least in part the predefined criteria and the set of predefined rules to determine the feasibility of such straps in the intermediate layer; and
  - configure a top layer of straps using at least in part the predefined criteria and the set of predefined rules to determine the feasibility of such straps in the top layer.

* * * * *